United States Patent
Chen et al.

(10) Patent No.: US 12,413,046 B2
(45) Date of Patent: Sep. 9, 2025

(54) PHOTONIC CRYSTAL SURFACE EMITTING LASER DEVICE

(71) Applicant: Phosertek Corporation, Hsinchu (TW)

(72) Inventors: Lih-Ren Chen, Hsinchu (TW);
Kuo-Bin Hong, Hsinchu (TW);
Tien-Chang Lu, Hsinchu (TW);
Chien-Hung Lin, Hsinchu (TW);
Hsiu-Ling Chen, Hsinchu (TW);
Kuan-Chih Huang, Hsinchu (TW)

(73) Assignee: Phosertek Corporation, Hsinchu (TW)

( * ) Notice: Subject to any disclaimer, the term of this patent is extended or adjusted under 35 U.S.C. 154(b) by 771 days.

(21) Appl. No.: 17/709,442

(22) Filed: Mar. 31, 2022

(65) Prior Publication Data
US 2022/0320827 A1 Oct. 6, 2022

Related U.S. Application Data

(60) Provisional application No. 63/169,255, filed on Apr. 1, 2021.

(30) Foreign Application Priority Data

May 10, 2021 (TW) ................. 110116735

(51) Int. Cl.
*H01S 5/11* (2021.01)
*H01S 5/042* (2006.01)
*H01S 5/183* (2006.01)

(52) U.S. Cl.
CPC ............ *H01S 5/11* (2021.01); *H01S 5/04256* (2019.08); *H01S 5/183* (2013.01)

(58) Field of Classification Search
CPC ........ H01S 5/11; H01S 5/04256; H01S 5/183; H01S 5/0207; H01S 5/02255; H01S 5/42;
(Continued)

(56) References Cited

U.S. PATENT DOCUMENTS

| 10,923,633 B2 | 2/2021 | Ho et al. |
| 2002/0106160 A1* | 8/2002 | Cox ................... H01S 5/18386 372/50.1 |

(Continued)

FOREIGN PATENT DOCUMENTS

| CN | 110247302 | 9/2019 |
| CN | 112673535 | 4/2021 |

(Continued)

OTHER PUBLICATIONS

Lih-Ren Chen et al., "Integration of multiple diffractive elements on photonic crystal surface emitting lasers for beam manipulation", CLEO 2020, May 2020, Grace Period Disclosure, pp. 1-2.
(Continued)

*Primary Examiner* — Yuanda Zhang
(74) *Attorney, Agent, or Firm* — JCIPRNET

(57) ABSTRACT

A photonic crystal surface emitting laser device including at least one photonic crystal surface emitting laser unit is provided. The photonic crystal surface emitting laser unit includes a light-emitting layer, a photonic crystal layer, a doped semiconductor layer, and a diffractive grating. The light-emitting layer is configured to emit a light beam. The photonic crystal layer is disposed on one side of the light-emitting layer. The doped layer is disposed on another side of the light-emitting layer. The diffractive grating is disposed on the photonic crystal layer or the doped semiconductor layer.

6 Claims, 15 Drawing Sheets

(58) Field of Classification Search
CPC ... H01S 5/185; H01S 5/04254; H01S 5/04257
See application file for complete search history.

(56) References Cited

U.S. PATENT DOCUMENTS

| | | | |
|---|---|---|---|
| 2019/0252855 A1* | 8/2019 | Lu | H01S 5/2059 |
| 2023/0198224 A1* | 6/2023 | Kurosaka | H01S 5/42 |
| | | | 372/38.05 |

FOREIGN PATENT DOCUMENTS

| | | |
|---|---|---|
| JP | 6213915 | 10/2017 |
| TW | I381602 | 1/2013 |
| TW | 201917964 | 5/2019 |
| TW | 201935787 | 9/2019 |
| TW | M615662 | 8/2021 |

OTHER PUBLICATIONS

Lih-Ren Chen et al., "Direct Integration of Beam Steering Structure on Photonic Crystal Surface Emitting Lasers", 2020 Opto-Electronics and Communications Conference (OECC), Oct. 2020, Grace Period Disclosure, pp. 1-3.

Lih-Ren Chen et al., "Vertically integrated diffractive gratings on photonic crystal surface emitting lasers", Scientific reports, Dec. 2021, Grace Period Disclosure, pp. 1-7.

Ryoichi Sakata et al., "Dually modulated photonic crystals enabling high-power high-beam-quality two-dimensional beam scanning lasers", Nature Communications, Jul. 2020, pp. 1-10.

Han-Lun Chiu et al., "Photonic Crystal Surface Emitting Lasers with Naturally Formed Periodic ITO Structures", ACS Photonics, Jan. 31, 2019, pp. 684-690.

* cited by examiner

PHOTONIC CRYSTAL SURFACE EMITTING LASER DEVICE

CROSS-REFERENCE TO RELATED APPLICATION

This application claims the priority benefit of U.S. provisional application Ser. No. 63/169,255 filed on Apr. 1, 2021, and Taiwan application serial no. 110116735 filed on May 10, 2021. The entirety of the above-mentioned patent applications are hereby incorporated by reference herein and made a part of this specification.

BACKGROUND

Technical Field

The disclosure relates to a laser device, and in particular relates to a photonic crystal surface emitting laser device.

Description of Related Art

An electroluminescent photonic crystal surface emitting laser may realize single mode output, narrow spectrum wavelength linewidth, and small exiting light divergence angle. The main structure of the electroluminescent photonic crystal surface emitting laser includes a bottom cladding layer, a light-emitting layer and a photonic crystal layer, where the light-emitting layer is located between the bottom cladding layer and the photonic crystal layer. Under this structure and operating mechanism, a laser light is emitted to the outside from at least one of the directions from a top portion or a bottom portion.

In combination with a micro-electro mechanical system (MEMS) optical device or a mechanically oscillating optical device such that the photonic crystal surface emitting laser generates dynamic deflection, a scanning effect may be achieved. However, both the micro-electro mechanical system and the mechanically oscillating optical device achieve a scanning effect by the mechanism of oscillation, thus issues such as the scanning speed being limited by the mechanical oscillating speed, and the reliability and durability of the devices being insufficient may arise.

SUMMARY

The disclosure provides a photonic crystal surface emitting laser device, which may determine an exiting light deflection direction of a laser beam by using a simple structure.

An embodiment of the disclosure provides a photonic crystal surface emitting laser device, including at least one photonic crystal surface emitting laser unit. The photonic crystal surface emitting laser unit includes a light-emitting layer, a photonic crystal layer, a doped semiconductor layer, and a diffractive grating. The light-emitting layer is configured to emit a light beam, and the photonic crystal layer is disposed on one side of the light-emitting layer. The doped semiconductor layer is disposed on another side of the light-emitting layer, and the diffractive grating is disposed on the photonic crystal layer or the doped semiconductor layer.

In the photonic crystal surface emitting laser device of the embodiment of the disclosure, since the diffractive grating disposed on the photonic crystal layer or the doped semiconductor layer is adopted to diffract the laser beam diffracted by the photonic crystal layer, therefore the exiting light deflection direction of the laser beam may be determined by using a simple structure.

DETAILED DESCRIPTION OF DISCLOSED EMBODIMENTS

Figure 1A:
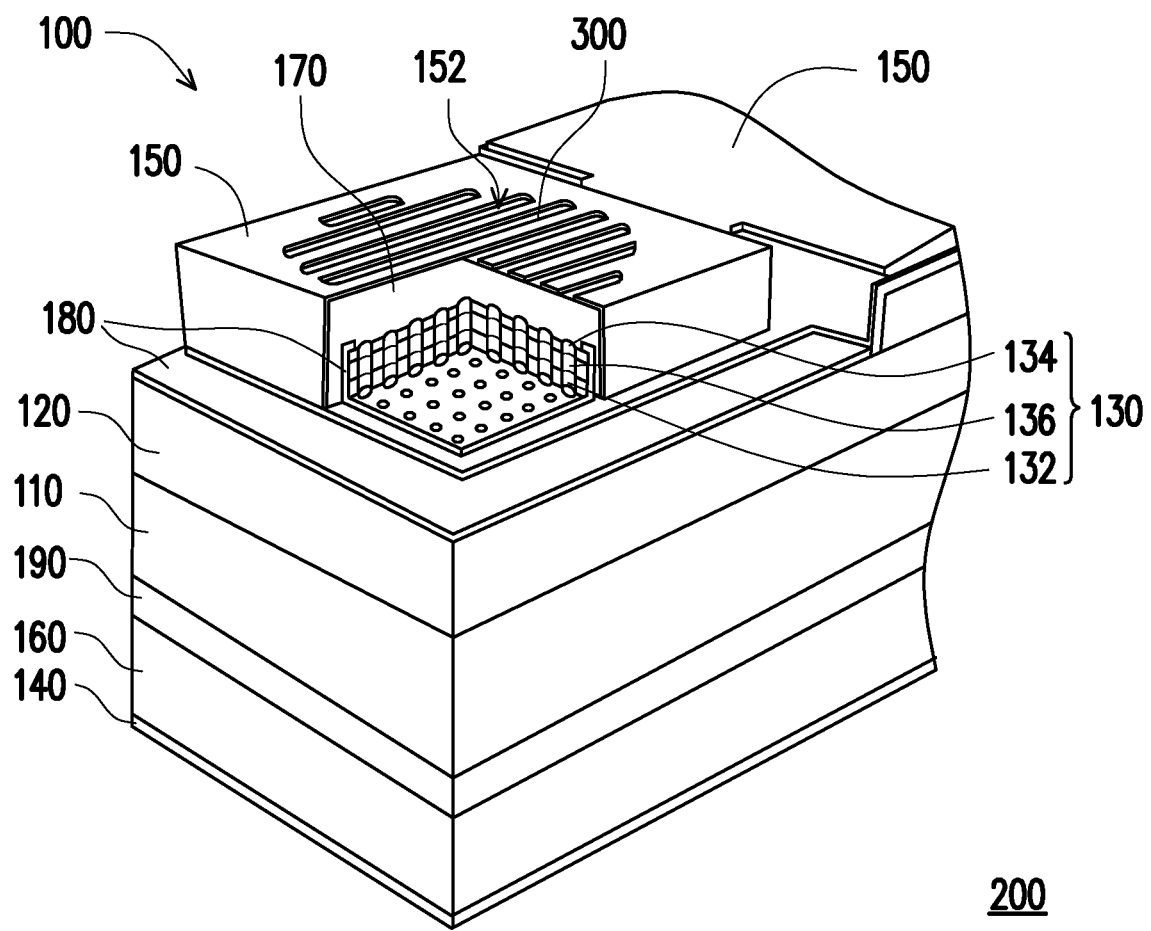
FIG. 1A is a perspective schematic view of a photonic crystal surface emitting laser device of an embodiment of the disclosure.
Figure 1B:
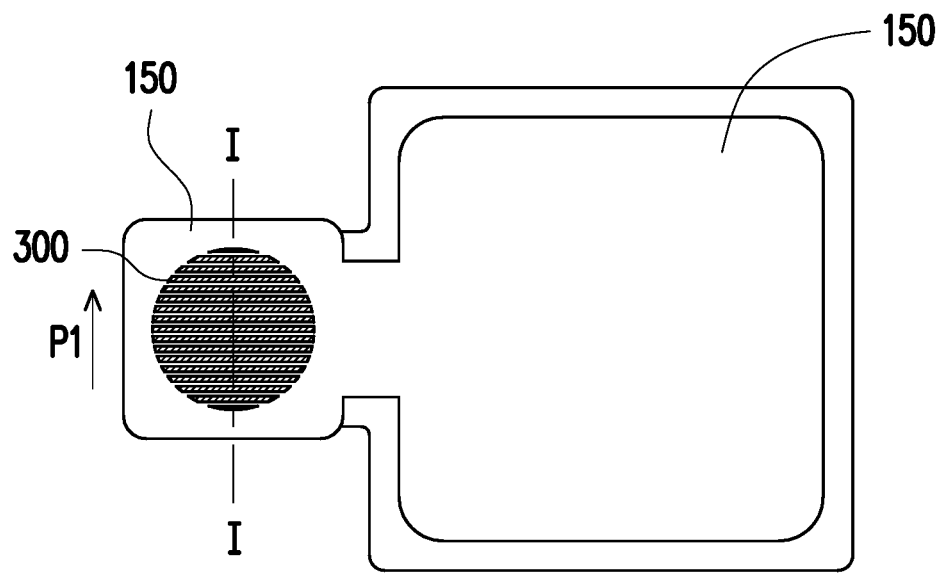
FIG. 1B is a top schematic view of the photonic crystal surface emitting laser device of FIG. 1A.
Figure 1C:
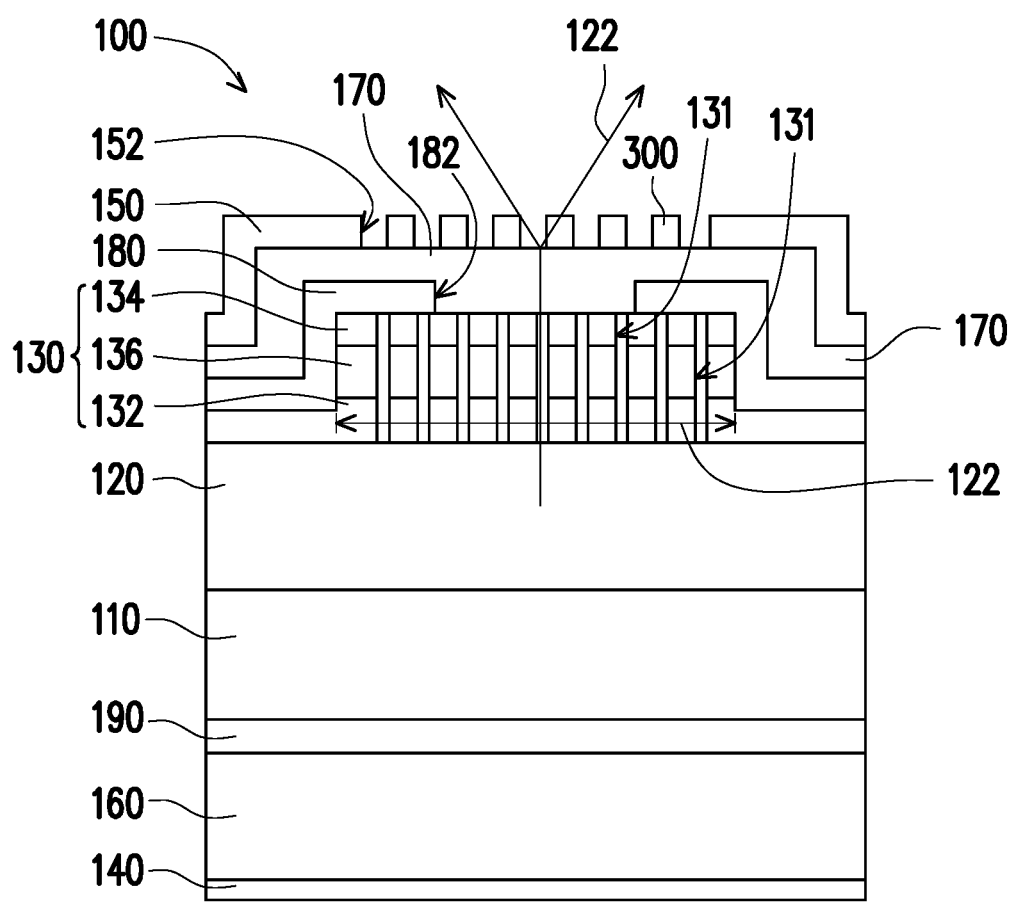
FIG. 1C is a cross-sectional schematic view of the photonic crystal surface emitting laser device of FIG. 1B along a line I-I.

FIG. 1A is a perspective schematic view of a photonic crystal surface emitting laser device of an embodiment of the disclosure, FIG. 1B is a top schematic view of the photonic crystal surface emitting laser device of FIG. 1A, and FIG. 1C is a cross-sectional schematic view of the photonic crystal surface emitting laser device of FIG. 1B along a line I-I. In FIG. 1A, a top portion of the photonic crystal surface emitting laser device is partially cut open, to show a portion of the internal structure. Referring to FIG. 1A, FIG. 1B, and FIG. 1C, a photonic crystal surface emitting laser device 200 of this embodiment includes at least one photonic crystal surface emitting laser unit 100 (FIG. 1A to FIG. 1C are illustrated with a photonic crystal surface emitting laser unit 100 as an example). The photonic crystal surface emitting laser unit 100 includes a light-emitting layer 120, a photonic crystal layer 130, a doped semiconductor layer 110, and a diffractive grating 300. The light-emitting layer 120 is configured to emit a light beam 122. In this embodiment, the light-emitting layer 120 includes a quantum well layer, a multiple quantum well layer, or a quantum dot layer, and the light beam 122 emitted by the light-emitting layer 120 may be an infrared light, a visible light or an ultraviolet light.

The photonic crystal layer 130 is disposed on one side of the light-emitting layer 120, and the doped semiconductor layer 110 is disposed on another side of the light-emitting layer 120. In this embodiment, the photonic crystal layer 130 is a P-type semiconductor layer, and the doped semiconductor layer 110 is an N-type semiconductor layer. However, in other embodiments, the photonic crystal layer 130 may be an N-type semiconductor layer, and the doped semiconductor layer 110 may be a P-type semiconductor layer. In addition, the diffractive grating 300 is disposed on the photonic crystal layer 130 or the doped semiconductor layer 110, and FIG. 1A and FIG. 1C are examples where the diffractive grating 300 is disposed on the photonic crystal layer 130.

In this embodiment, the photonic crystal surface emitting laser device 200 further includes a first electrode 140 electrically connected to the doped semiconductor layer 110. The photonic crystal surface emitting laser unit 100 further includes a second electrode 150 disposed on the photonic crystal layer 130 and electrically connected to the photonic crystal layer 130. In this embodiment, by applying a forward bias voltage to the second electrode 150 and the first electrode 140, the electron holes in the photonic crystal layer 130 and the electrons in the doped semiconductor layer 110 may be mobilized into the light-emitting layer 120, and recombined in the light-emitting layer 120 to generate the light beam 122.

The light beam 122 emitted by the light-emitting layer 120 generates a resonance in a horizontal direction in FIG. 1C in the photonic crystal layer 130, and the photonic crystal layer 130 may include a second-order grating structure, which directs the light beam 122 to a vertical direction in FIG. 1C, transmitting the light beam 122 toward the top and bottom of FIG. 1C. That is, the light-emitting layer 120 is a gain medium that emits the light beam 122 and provides an optical gain. After the light beam 122 enters the photonic crystal layer 130 and generates a diffraction resonance, a laser beam radiating in the vertical direction is generated. In addition, the structure of the second-order grating may be a structure with a two-dimensional hole array. In other embodiments, the photonic crystal layer 130 may also be a grating structure with a third or higher order, and in addition, the photonic crystal layer 130 may also be a one-dimensional grating structure. After the light beam 122 is diffracted by the photonic crystal layer 130 and the diffractive grating 300, the light beam 122 is emitted from the photonic crystal surface emitting laser unit 100. In other embodiments, the photonic crystal layer 130 may also include paired up circular or rectangular holes in a configuration of a two-dimensional array, a triangular hole array, or various other possible photonic crystal structures.

In the photonic crystal surface emitting laser device 200 of this embodiment, the diffractive grating 300 disposed on the photonic crystal layer 130 or the doped semiconductor layer 110 is adopted to diffract the light beam 122 diffracted by the photonic crystal layer 130 (i.e., the laser beam). Therefore, the exiting deflection direction of the light beam 122 (i.e., the laser beam) may be determined by using a simple structure.

In this embodiment, a portion of the second electrode 150 is the diffractive grating 300. For example, as shown in FIG. 1A and FIG. 1C, periodically arranged elongated slits 152 are formed at a center portion of the second electrode 150 to form the diffractive grating 300. However, in other embodiments, there may be an opening in the center of the second electrode 150, and a diffractive grating 300 formed of a material different from that of the second electrode 150 is disposed in the opening. The material of the diffractive grating 300 may be a metal, a semiconductor, or an oxide.

In this embodiment, the photonic crystal surface emitting laser unit 100 further includes a transparent conductive layer 170 disposed between the photonic crystal layer 130 and the second electrode 150 to electrically connect the photonic crystal layer 130 and the second electrode 150. In this embodiment, the photonic crystal surface emitting laser device 200 further includes a substrate 160 disposed between the doped semiconductor layer 110 and the first electrode 140, and electrically connected to the doped semiconductor layer 110 and the first electrode 140, in addition, the substrate 160 has conductivity.

In this embodiment, the photonic crystal layer 130 includes a cladding layer 132, a graded index layer (GRIN layer) 136, and an ohmic contact layer 134. The cladding layer 132 is disposed on the light-emitting layer 120, and the graded index layer 136 is disposed on the cladding layer 132. The ohmic contact layer 134 is disposed between the graded index layer 136 and the transparent conductive layer 170, and is in contact with the transparent conductive layer 170 to form an ohmic contact. The cladding layer 132, the graded index layer 136, and the ohmic contact layer 134 have a photonic crystal structure. For example, the photonic crystal layer 130 has multiple through holes 131 located in the cladding layer 132, the graded index layer 136, and the ohmic contact layer 134, and extends from the cladding layer 132 to the ohmic contact layer 134 to form a photonic crystal structure. In this embodiment, the through hole 131 penetrates through the ohmic contact layer 134, the graded index layer 136, and the cladding layer 132. In addition, in one embodiment, the through holes 131 may be arranged in a two-dimensional array in directions parallel to the substrate 160. In this embodiment, the photonic crystal surface emitting laser unit 100 further includes a current confinement layer 180 disposed between the photonic crystal layer 130 and the transparent conductive layer 170, and has an opening 182. The transparent conductive layer 170 is connected to the photonic crystal layer 130 through the opening 182.

In this embodiment, the photonic crystal surface emitting laser unit 100 further includes a graded index layer 190 disposed between the substrate 160 and the doped semiconductor layer 110, where the doped semiconductor layer 110 is a cladding layer.

Figure 1D:
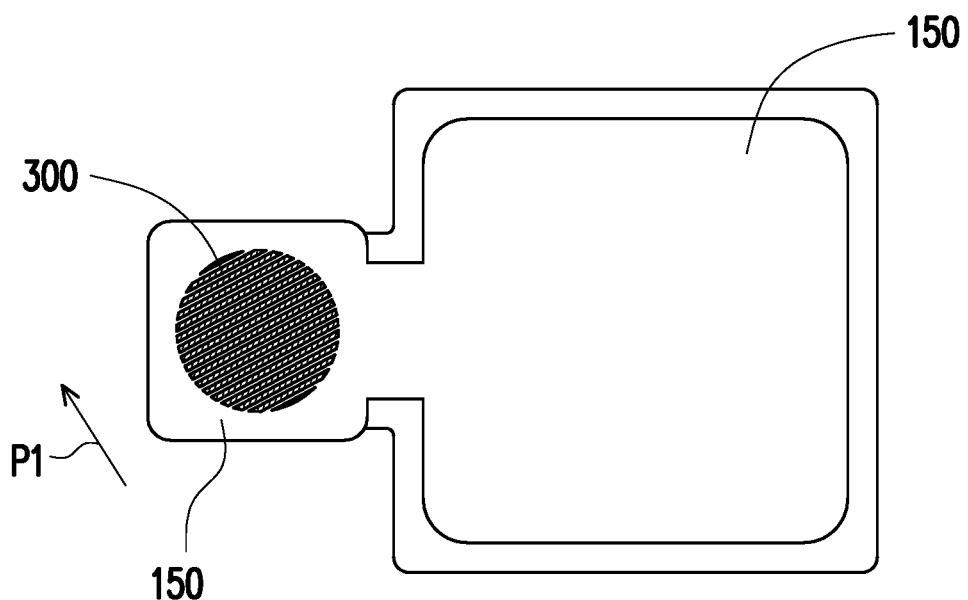
FIG. 1D and FIG. 1E are respective top schematic views of the photonic crystal surface emitting laser device of another two embodiments of the disclosure.
Figure 1E:
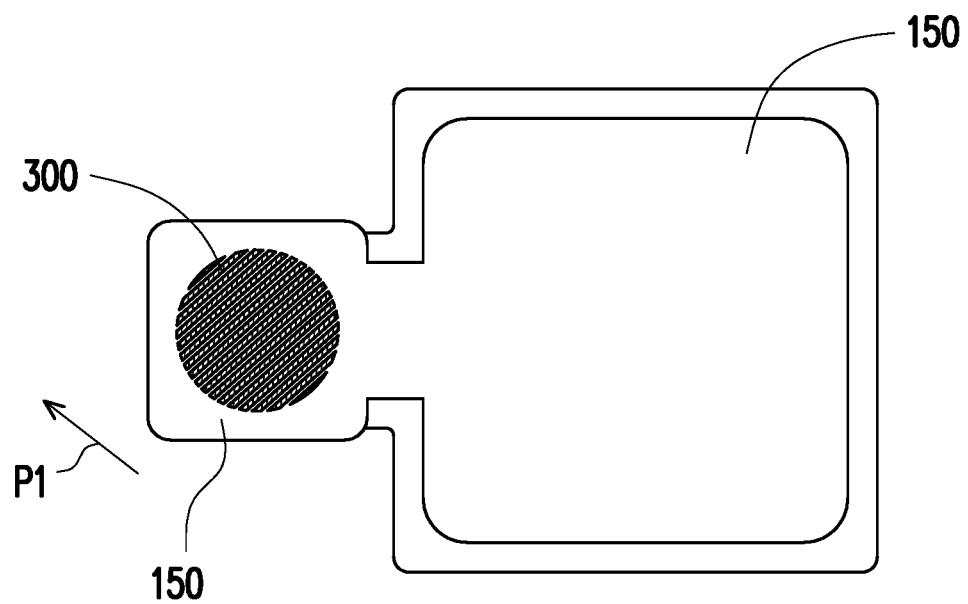

In addition, in FIG. 1B, a periodic direction P1 of the diffractive grating 300 is along a line I-I. However, in other embodiments, as shown in FIG. 1D and FIG. 1E, the periodic direction P1 of the diffractive grating 300 may also be along other directions according to the actual required deflection direction of the light beam 122.

Referring to FIG. 1A to FIG. 1C again, the disclosure does not limit the material of each of the film layers. In some embodiments, the material of the substrate 160 may be gallium nitride (GaN), gallium arsenide (GaAs), indium phosphide (InP), gallium antimonide (GaSb), indium arsenide (InAs), or other suitable materials. In other embodiments, when the first electrode 140 may be electrically connected to the doped semiconductor layer 110 without being electrically connected to the doped semiconductor layer 110 through the substrate 160, the substrate 160 may be a semi-insulating substrate or an insulating substrate, such as a sapphire substrate. The material of the light-emitting layer 120 may include gallium nitride, aluminum gallium nitride (AlGaN), gallium arsenide, indium gallium arsenide (InGaAs), aluminum gallium arsenide (AlGaAs), gallium phosphide (GaP), indium arsenide (InAs), indium arsenic antimonide (InAsSb), indium gallium arsenic antimonide (InGaAsSb), aluminum gallium arsenic antimonide (AlGaAsSb), indium gallium arsenide phosphide (InGaAsP), aluminum indium gallium arsenide (AlInGaAs), other suitable semiconductor materials, or a combination thereof, and the light-emitting layer 120 may adopt two or more different materials, or two or more materials of the same compound but with different elemental ratios to form a quantum well layer, a multiple quantum well layer, or a quantum dot structure. The materials of the cladding layer 132, the doped semiconductor layer 110, and the graded index layer 136 and the graded index layer 190 are, for example, aluminum gallium arsenide (AlGaAs), gallium arsenide, aluminum gallium nitride, aluminum gallium indium arsenide (AlGaInAs), aluminum gallium indium phosphide (AlGaInP), aluminum gallium arsenide antimonide, or other suitable materials. The material of the ohmic contact layer 134 may be gallium nitride, gallium arsenide, indium gallium arsenide phosphide (InGaAsP), indium gallium arsenide (InGaAs), or other suitable materials. In addition, the ohmic contact layer 134 may be heavily doped with beryllium, carbon, zinc, or a combination thereof, to form P-type doping, so as to establish a good ohmic contact with the transparent conductive layer 170. The concentration of the beryllium doping may be about $10^{19}$ cm$^{-3}$, the concentration of the carbon doping may be about $10^{19}$ cm$^{-3}$ to $10^{20}$ cm$^{-3}$, and the concentration of the zinc doping may be about $10^{19}$ cm$^{-3}$ to $10^{20}$ cm$^{-3}$, but the disclosure is not limited thereto. The material of the current confinement layer 180 may be silicon nitride, silicon oxide, or other suitable materials. The current confinement layer 180 may block current, so that the current is concentrated at the opening 182 and passes through the opening 182.

The material of the transparent conductive layer 170 is, for example, indium tin oxide (no), antimony tin oxide (ATO), fluorine doped tin oxide (FTO), aluminum zinc oxide (AZO), gallium zinc oxide (GZO), indium zinc oxide (IZO), zinc oxide (ZnO), graphene, or other suitable transparent conductive materials. The first electrode 140 and the second electrode 150 may be metal electrodes, the material thereof is, for example, gold, titanium-gold alloy, titanium-platinum-gold alloy, nickel-germanium-gold alloy, or other suitable metals. The transparent conductive layer 170 may conduct current to concentrate the current to pass through the opening 182, and at the same time, the transparent conductive layer 170 may also allow the light beam 122 emitted by the light-emitting layer 120 to penetrate without blocking the light beam 122.

In addition, in one embodiment, in each of the above-mentioned film layers, the P-type doping may be beryllium, carbon, zinc, or a combination thereof, and the doping concentration thereof is, for example, about $10^{17}$ cm$^{-3}$ to $10^{18}$ cm$^{-3}$ (Except that the doping concentration of the ohmic contact layer 134 is about $10^{19}$ cm$^{-3}$ to $10^{20}$ cm$^{-3}$), and the N-type doping may be silicon doping, and its doping concentration is, for example, about $10^{17}$ cm$^{-3}$ to $10^{18}$ cm$^{-3}$, but the disclosure is not limited thereto. In other embodiments, other suitable elements may also be adopted for doping to achieve P-type doping and N-type doping.

In this embodiment, the substrate 160, the graded index layer 190, and the doped semiconductor layer 110 are all N-type doped semiconductor layers, while the photonic crystal layer 130 including the cladding layer 132, the graded index layer 136, and the ohmic contact layer 134 are all P-type doped semiconductor layers. However, in other embodiments, the substrate 160, the graded index layer 190, and the doped semiconductor layer 110 may all be P-type doped semiconductor layers, while the cladding layer 132, the graded index layer 136, and the ohmic contact layer 134 are all N-type doped semiconductor layers.

The material of the diffractive grating 300 may be a metal, silicon, a semiconductor, a transparent conductive layer (such as indium tin oxide, indium zinc oxide, or aluminum zinc oxide, etc.). The diffractive grating 300 may be a one-dimensional grating (such as a stripe-shaped grating) or a two-dimensional grating (such as a line array, a through hole array, a column array, or a polygonal array), or a microlens array.

Figure 2A:
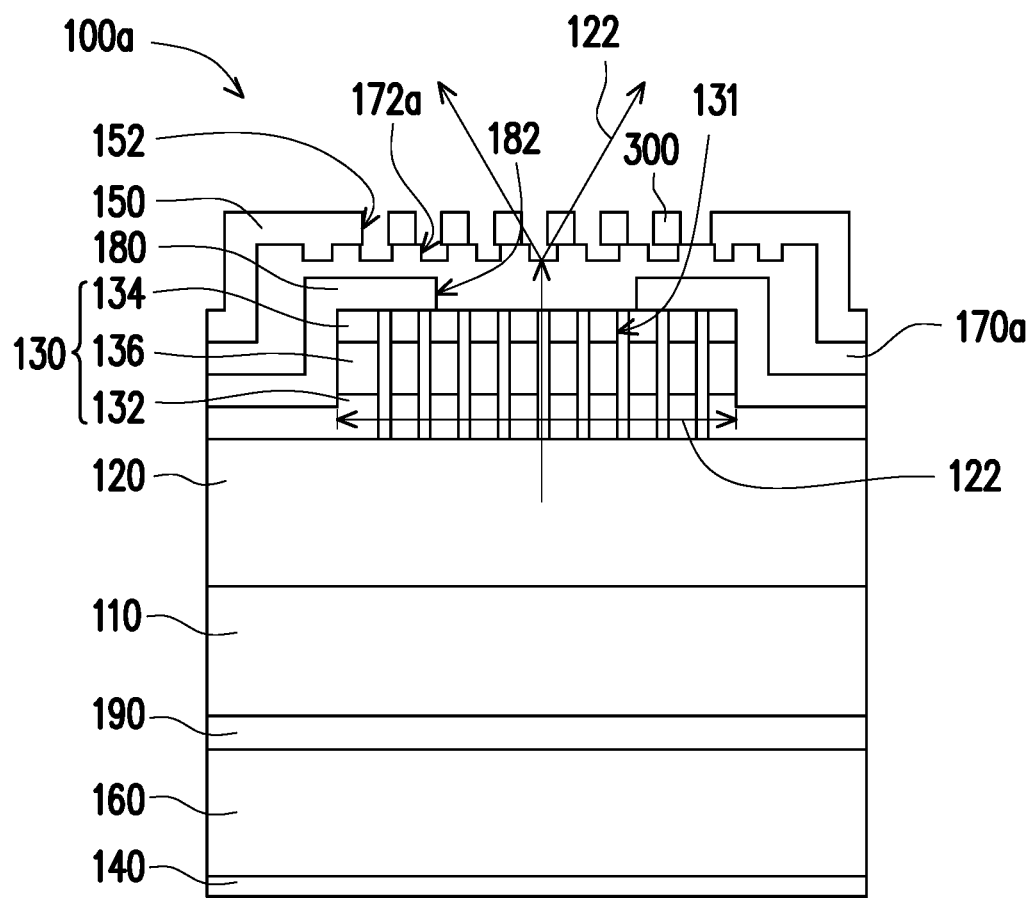
FIG. 2A is a cross-sectional schematic view of a photonic crystal surface emitting laser device of another embodiment of the disclosure.
Figure 2B:
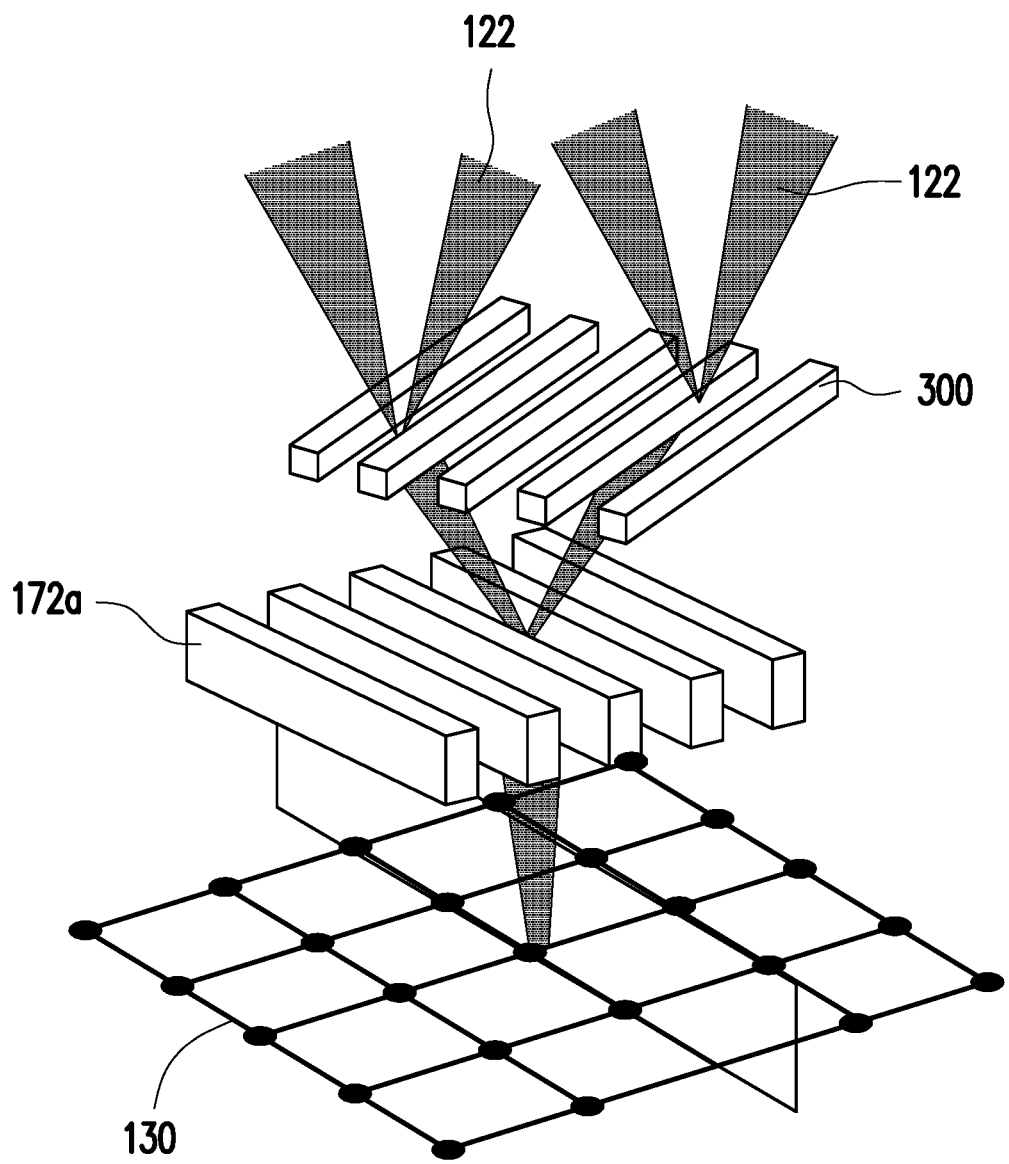
FIG. 2B is a simplified perspective schematic view of a photonic crystal layer, a diffractive grating surface of a transparent conductive layer, and a diffractive grating in FIG. 2A.

FIG. 2A is a cross-sectional schematic view of a photonic crystal surface emitting laser device of another embodiment of the disclosure, FIG. 2B is a simplified perspective schematic view of a photonic crystal layer, a diffractive grating surface of a transparent conductive layer, and a diffractive grating in FIG. 2A. Referring to FIG. 2A and FIG. 2B, a photonic crystal surface emitting laser device 200a of this embodiment is similar to the photonic crystal surface emitting laser device 200 of FIG. 1C, and the differences between the two are as described below. In a photonic crystal surface emitting laser unit 100a of the photonic crystal surface emitting laser device 200a, a surface of a transparent conductive layer 170a facing away from the light-emitting layer 120 is a diffractive grating surface 172a. A periodic direction of the diffractive grating surface 172a and the periodic direction of the diffractive grating 300 may be the same or different, and FIG. 2B is illustrated with an acute angle between the periodic direction of the diffractive grating 300 and the periodic direction of the diffractive grating surface 172a as an example. When the light beam 122 is diffracted twice by the diffractive grating surface 172a and the diffractive grating 300, more changes may occur to the deflection angle. For example, as shown in FIG. 2B, the light beam 122 may be divided into two beams after being diffracted by the diffractive grating surface 172a, and the two light beams 122 may be divided into a total of four light beams 122 after being diffracted by the diffractive grating 300. An included angle of the divided light beams 122 may be controlled by a period of the diffractive grating. On the other hand, in the photonic crystal surface emitting laser device 200 shown in FIG. 1C, since the surface of the transparent conductive layer 170 facing away from the light-emitting layer 120 is a smooth surface, the light beam 122 is divided into two light beams 122 only by being diffracted by the diffractive grating 300.

In this embodiment, the diffractive grating surface 172a may be formed naturally by a deposition process of the transparent conductive layer 170a when a thicker transparent conductive layer 170a is deposited, or may be additionally formed by an etching process.

In one embodiment, the diffractive grating surface 172a may be a one-dimensional grating (such as a stripe-shaped grating) or a two-dimensional grating (such as a line array, a through hole array, a column array, or a polygonal array), or a microlens array.

Figure 3:
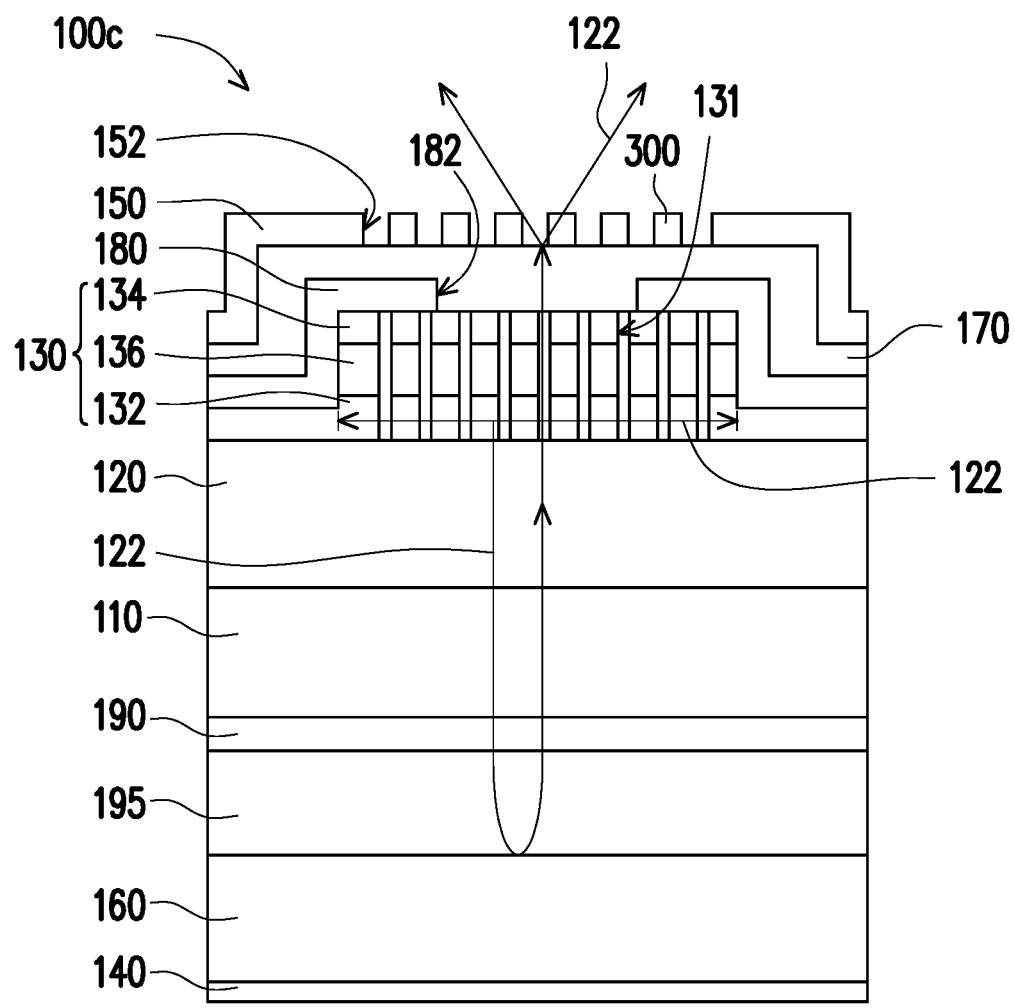
FIG. 3 is a cross-sectional schematic view of a photonic crystal surface emitting laser device of yet another embodiment of the disclosure.

FIG. 3 is a cross-sectional schematic view of a photonic crystal surface emitting laser device of yet another embodiment of the disclosure. Referring to FIG. 3, a photonic crystal surface emitting laser device 200c of this embodiment is similar to the photonic crystal surface emitting laser device 200 of FIG. 1C, and the differences between the two are as described below. A photonic crystal surface emitting laser unit 100c of the photonic crystal surface emitting laser device 200c of this embodiment further includes a distributed Bragg reflector (DBR) 195 disposed between the doped semiconductor layer 110 and the substrate 160, so that the light beam 122 diffracted from the photonic crystal layer 130 toward the bottom of FIG. 3 is reflected in the direction of the diffractive grating 300. In this way, the light energy of the light beam 122 exiting from the diffractive grating 300 may be increased, so as to achieve better light utilization efficiency.

Figure 4:
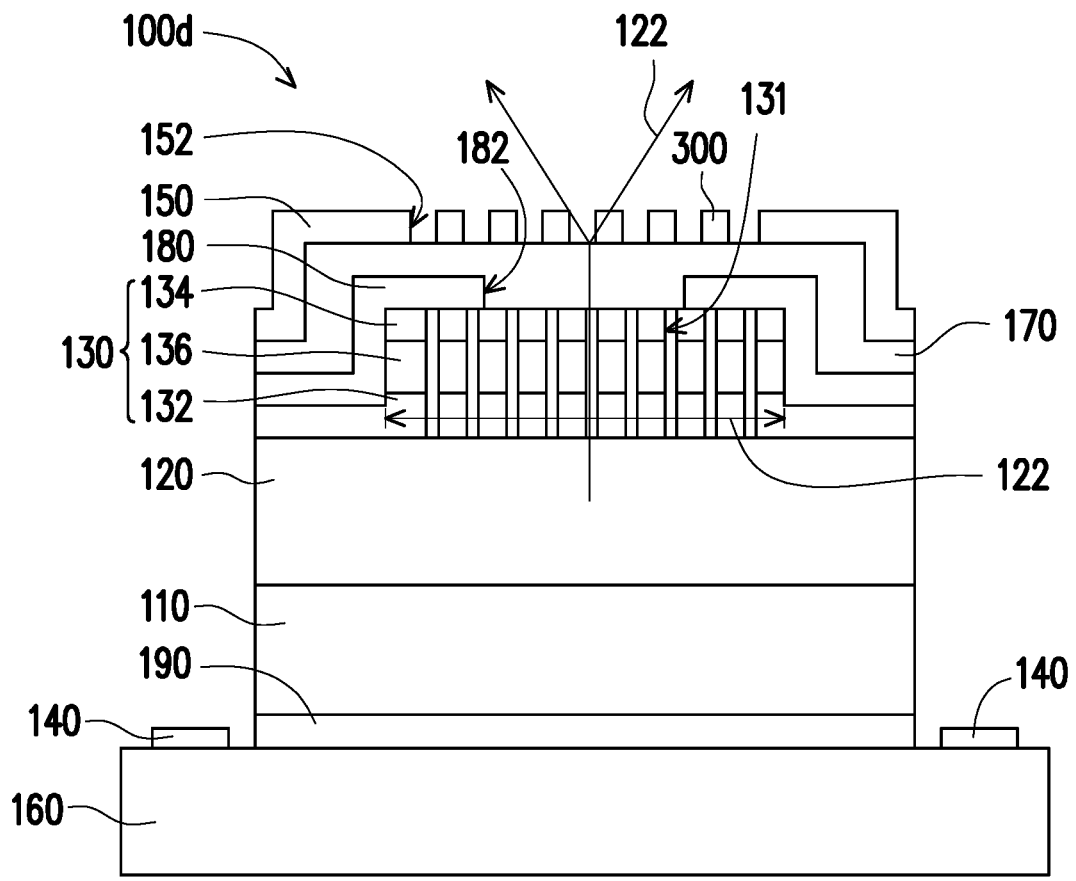
FIG. 4 is a cross-sectional schematic view of a photonic crystal surface emitting laser device of another embodiment of the disclosure.

FIG. 4 is a cross-sectional schematic view of a photonic crystal surface emitting laser device of another embodiment of the disclosure. Referring to FIG. 4, a photonic crystal surface emitting laser device 200d of this embodiment is similar to the photonic crystal surface emitting laser device 200 of FIG. 1C, and the differences between the two are as described below. In a photonic crystal surface emitting laser unit 100d of the photonic crystal surface emitting laser device 200d of this embodiment, the doped semiconductor layer 110 and the first electrode 140 are disposed on the same side of the substrate 160.

Figure 5:
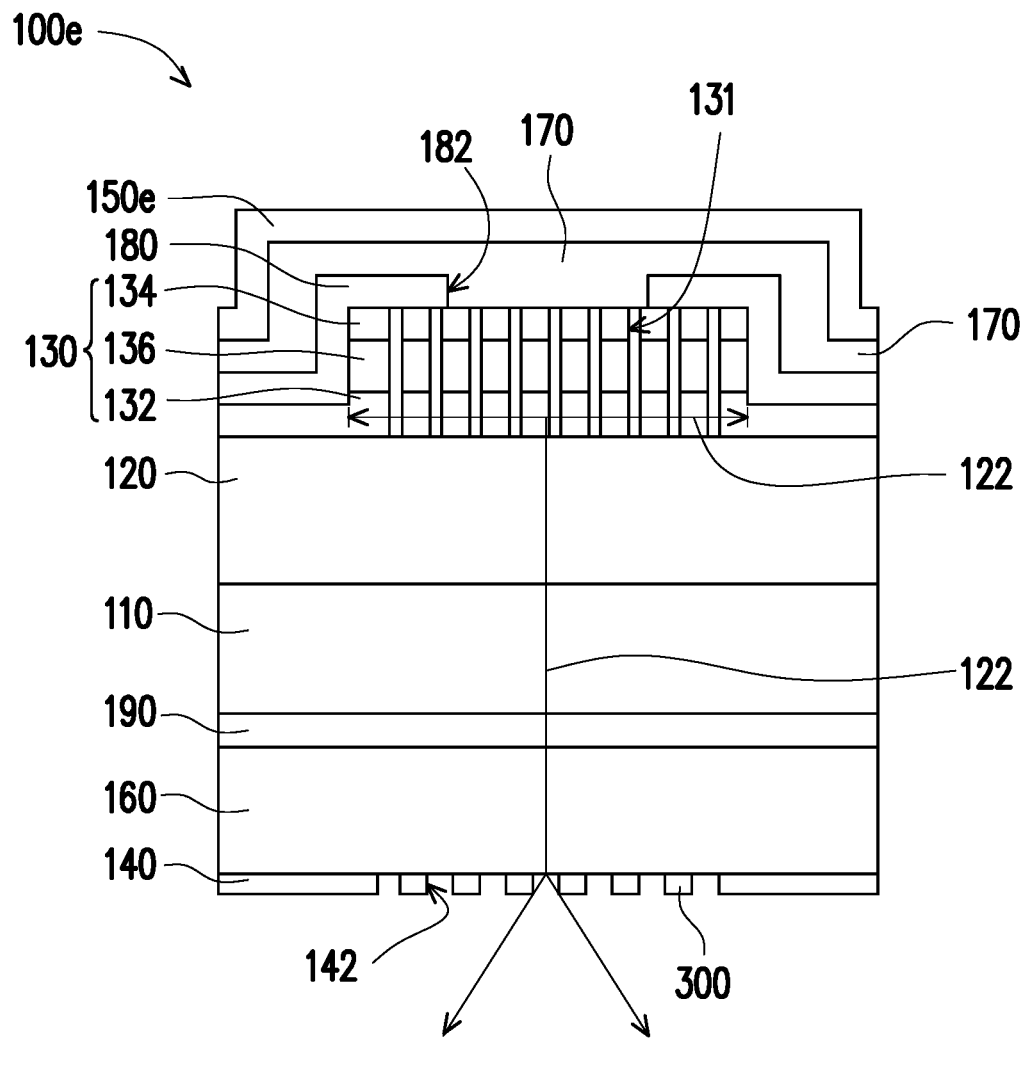
FIG. 5 is a cross-sectional schematic view of a photonic crystal surface emitting laser device of yet another embodiment of the disclosure.

FIG. 5 is a cross-sectional schematic view of a photonic crystal surface emitting laser device of yet another embodiment of the disclosure. Referring to FIG. 5, a photonic crystal surface emitting laser device 200e of this embodiment is similar to the photonic crystal surface emitting laser device 200 of FIG. 1C, and the differences between the two are as described below. In a photonic crystal surface emitting laser unit 100e of the photonic crystal surface emitting laser device 200e of this embodiment, the diffractive grating 300 is disposed on one side of the doped semiconductor layer 110, and in the example of FIG. 5, the substrate 160 is disposed between the doped semiconductor layer 110 and the diffractive grating 300. In this embodiment, the diffractive grating 300 may be a portion of the first electrode 140, that is, periodically arranged elongated slits 142 are at a center of the first electrode 140 to form the diffractive grating 300. Alternatively, in other embodiments, the material of the diffractive grating 300 may also be other metals, semiconductors, or oxides different from the material of the first electrode 140. The first electrode 140 has an opening in the center, and the diffractive grating 300 is disposed in the opening.

On the other hand, in this embodiment, the photonic crystal layer 130 is covered by a second electrode 150e, and the light beam 122 exits toward the bottom of FIG. 5.

Figure 6:
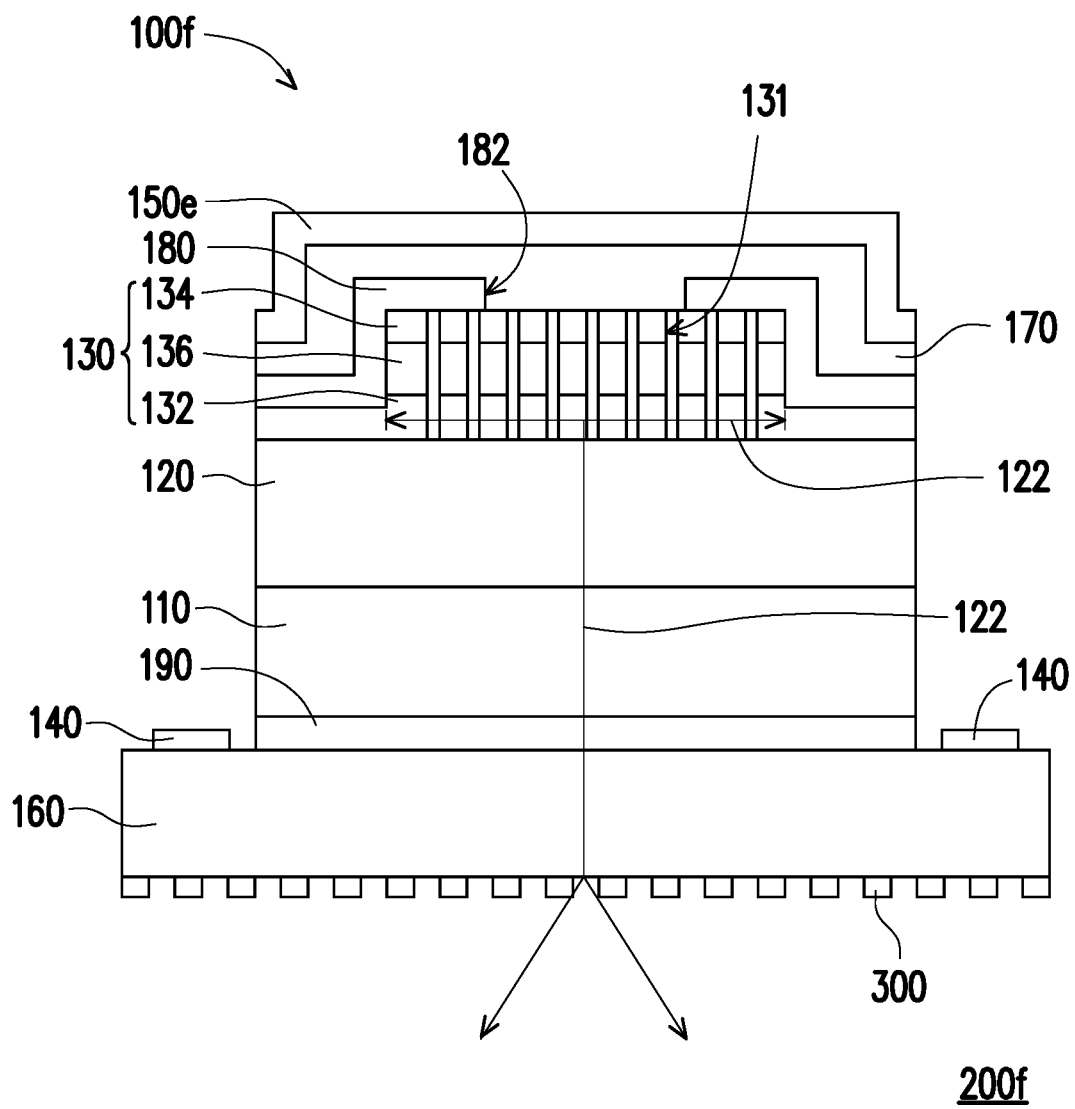
FIG. 6 is a cross-sectional schematic view of a photonic crystal surface emitting laser device of yet another embodiment of the disclosure.

FIG. 6 is a cross-sectional schematic view of a photonic crystal surface emitting laser device of yet another embodiment of the disclosure. Referring to FIG. 6, a photonic crystal surface emitting laser device 200f of this embodiment is similar to the photonic crystal surface emitting laser device 200e of FIG. 5, and the differences between the two are as described below. In a photonic crystal surface emitting laser unit 100f of the photonic crystal surface emitting laser device 200f of this embodiment, the doped semiconductor layer 110 and the first electrode 140 are disposed on the same side of the substrate 160, and the diffractive grating 300 and the first electrodes 140 are respectively disposed on opposite sides of the substrate 160.

Figure 7:
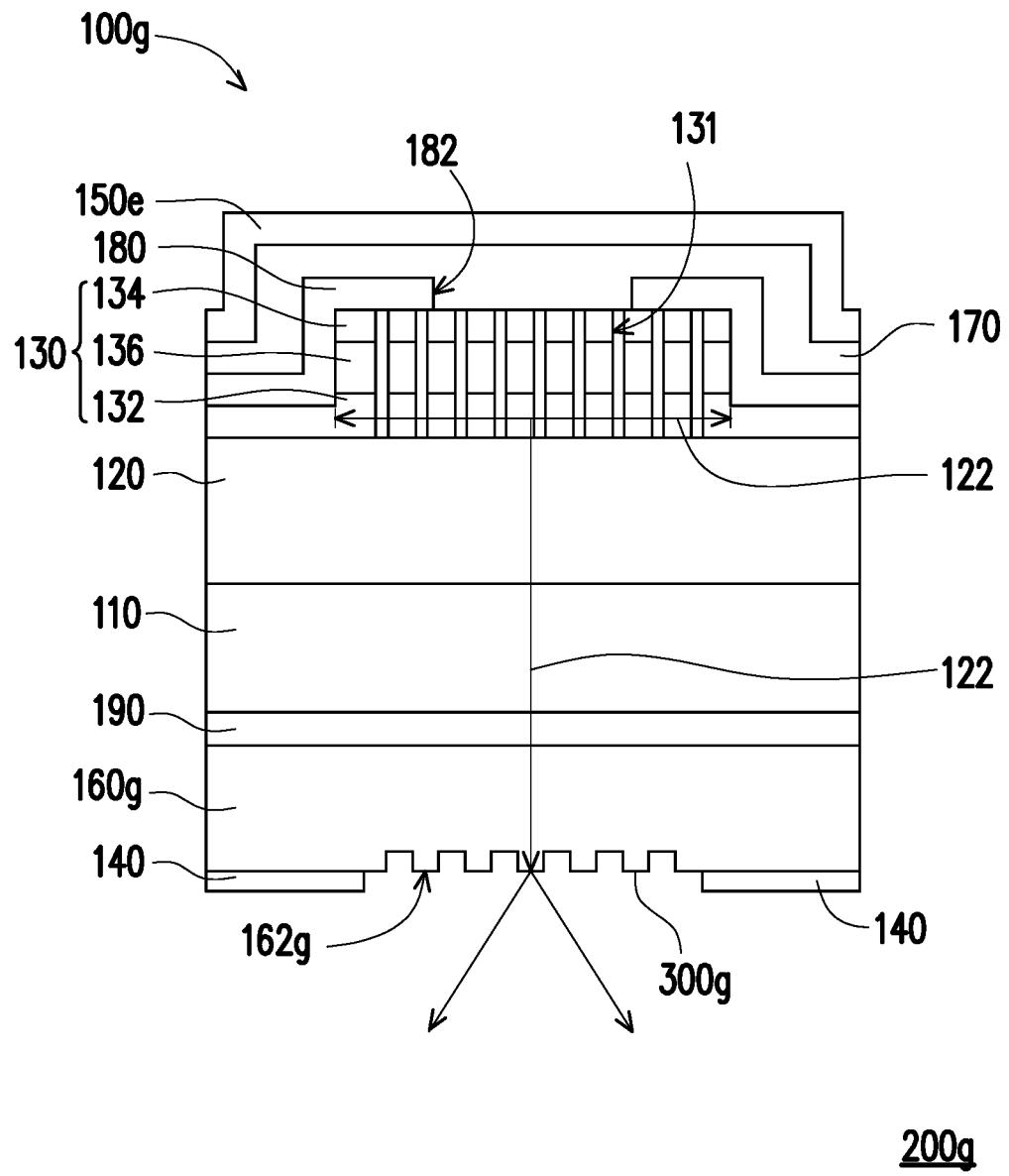
FIG. 7 is a cross-sectional schematic view of a photonic crystal surface emitting laser device of yet another embodiment of the disclosure.

FIG. 7 is a cross-sectional schematic view of a photonic crystal surface emitting laser device of yet another embodiment of the disclosure. Referring to FIG. 7, a photonic crystal surface emitting laser device 200g of this embodiment is similar to the photonic crystal surface emitting laser device 200e of FIG. 5, and the differences between the two are as described below. In a photonic crystal surface emitting laser unit 100g of the photonic crystal surface emitting laser device 200g of this embodiment, the surface of the substrate 160g facing away from the light-emitting layer 120 has a diffractive grating surface structure 162g to form a diffractive grating 300g.

Figure 8:
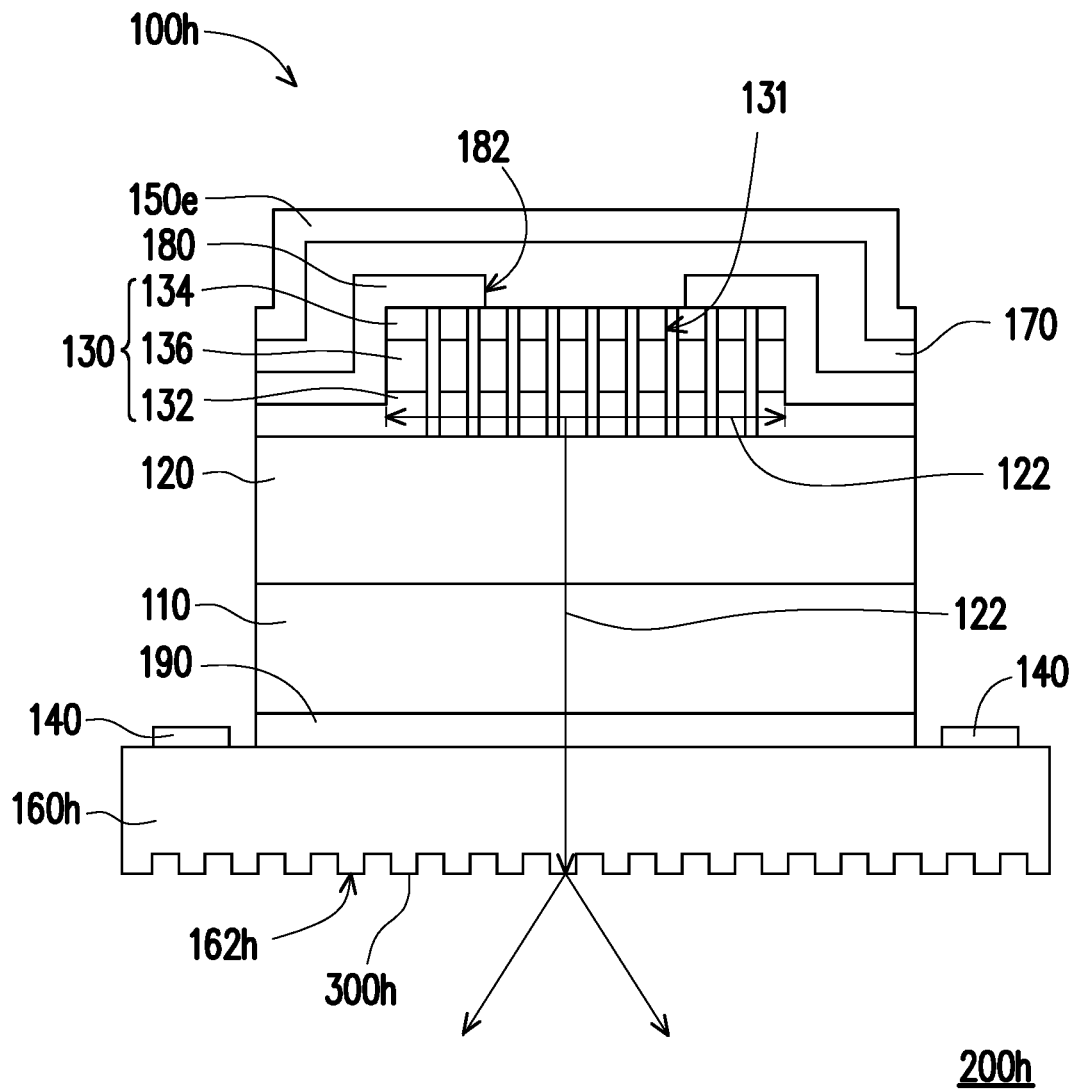
FIG. 8 is a cross-sectional schematic view of a photonic crystal surface emitting laser device of another embodiment of the disclosure.

FIG. 8 is a cross-sectional schematic view of a photonic crystal surface emitting laser device of another embodiment of the disclosure. Referring to FIG. 8, a photonic crystal surface emitting laser device 200h of this embodiment is similar to the photonic crystal surface emitting laser device 200f of FIG. 6, and the differences between the two are as described below. In a photonic crystal surface emitting laser unit 100h of the photonic crystal surface emitting laser device 200h of this embodiment, the surface of the substrate 160h facing away from the light-emitting layer 120 has a diffractive grating surface structure 162h to form a diffractive grating 300h.

Figure 9:
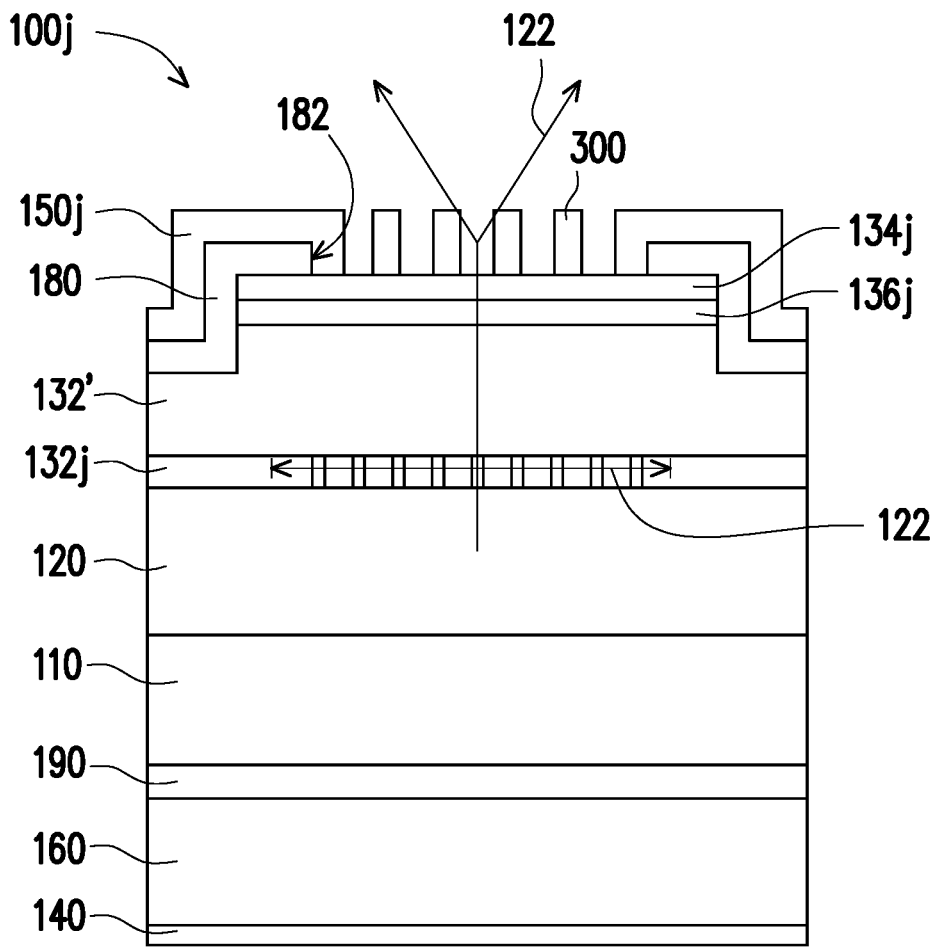
FIG. 9 is a cross-sectional schematic view of a photonic crystal surface emitting laser device of yet another embodiment of the disclosure.

FIG. 9 is a cross-sectional schematic view of a photonic crystal surface emitting laser device of yet another embodiment of the disclosure. Referring to FIG. 9, a photonic crystal surface emitting laser device 200j of this embodiment is similar to the photonic crystal surface emitting laser device 200 of FIG. 1C, and the differences between the two are as described below. In a photonic crystal surface emitting laser unit 100j of the photonic crystal surface emitting laser device 200j of this embodiment, the cladding layer 132j has a photonic crystal structure, and is covered by a semiconductor layer 132'. The material of the semiconductor layer 132' is similar to or the same as that of the cladding layer 132j, and may be a P-type or an N-type doped semiconductor layer along with the cladding layer 132j. A graded index layer 136j and an ohmic contact layer 134j may be sequentially disposed on the semiconductor layer 132'. The edges of the semiconductor layer 132' and the ohmic contact layer 134j are covered by the current confinement layer 180, and the center of the ohmic contact layer 134j is exposed by the opening 182 of the current confinement layer 180. The second electrode 150 is connected to the ohmic contact layer 134j through the opening 182, and the diffractive grating 300 is located in the center of the ohmic contact layer 134j.

Figure 10:
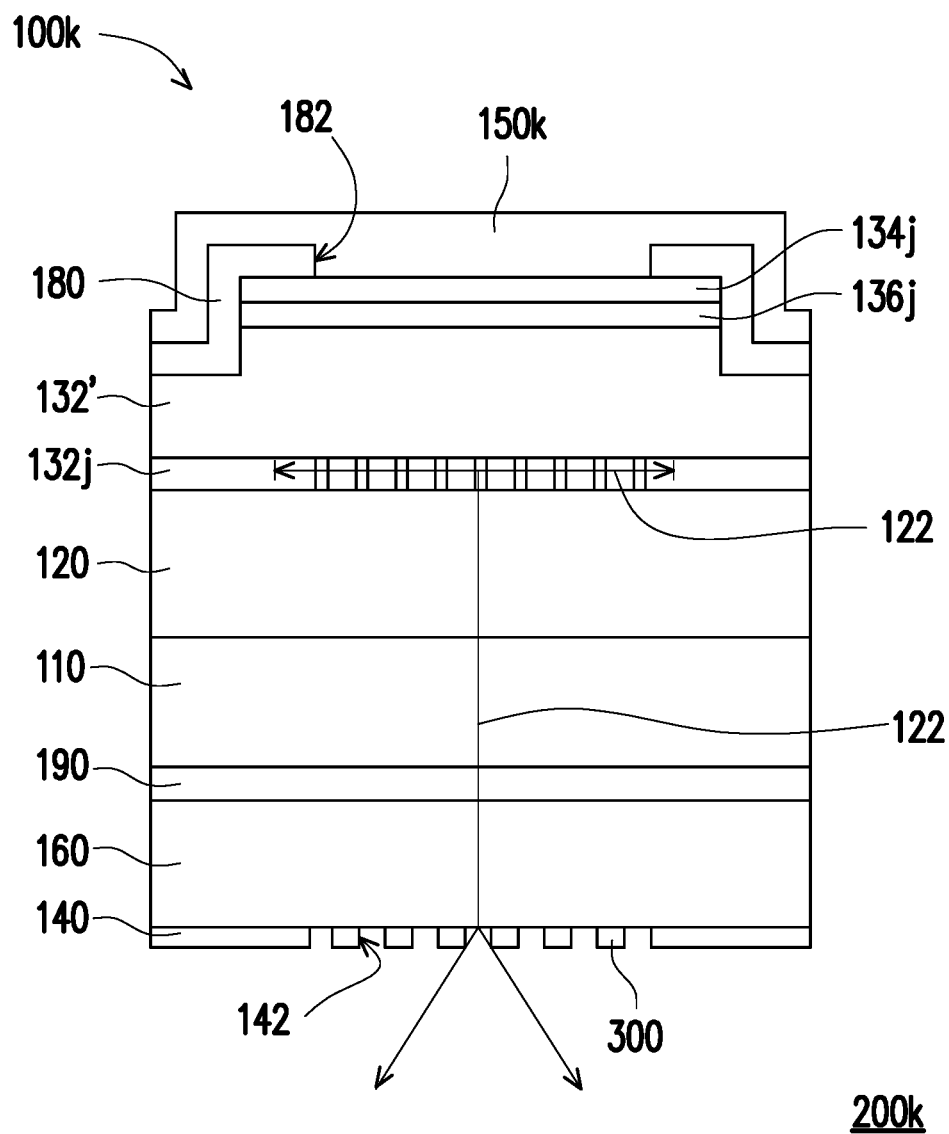
FIG. 10 is a cross-sectional schematic view of a photonic crystal surface emitting laser device of yet another embodiment of the disclosure.

FIG. 10 is a cross-sectional schematic view of a photonic crystal surface emitting laser device of yet another embodiment of the disclosure. Referring to FIG. 10, a photonic crystal surface emitting laser device 200k of this embodiment is similar to the photonic crystal surface emitting laser device 200e of FIG. 5 and the photonic crystal surface emitting laser device 200j of FIG. 9, and the differences are as described below. In a photonic crystal surface emitting laser unit 100k of the photonic crystal surface emitting laser device 200k of this embodiment, the photonic crystal layer 130 of FIG. 5 are replaced by the cladding layer 132j, the semiconductor layer 132', the graded index layer 136j, and the ohmic contact layer 134j of FIG. 9, and the photonic crystal surface emitting laser unit 100k does not include the transparent conductive layer 170. The second electrode 150k is connected to the ohmic contact layer 134j through the opening 182.

Figure 11:
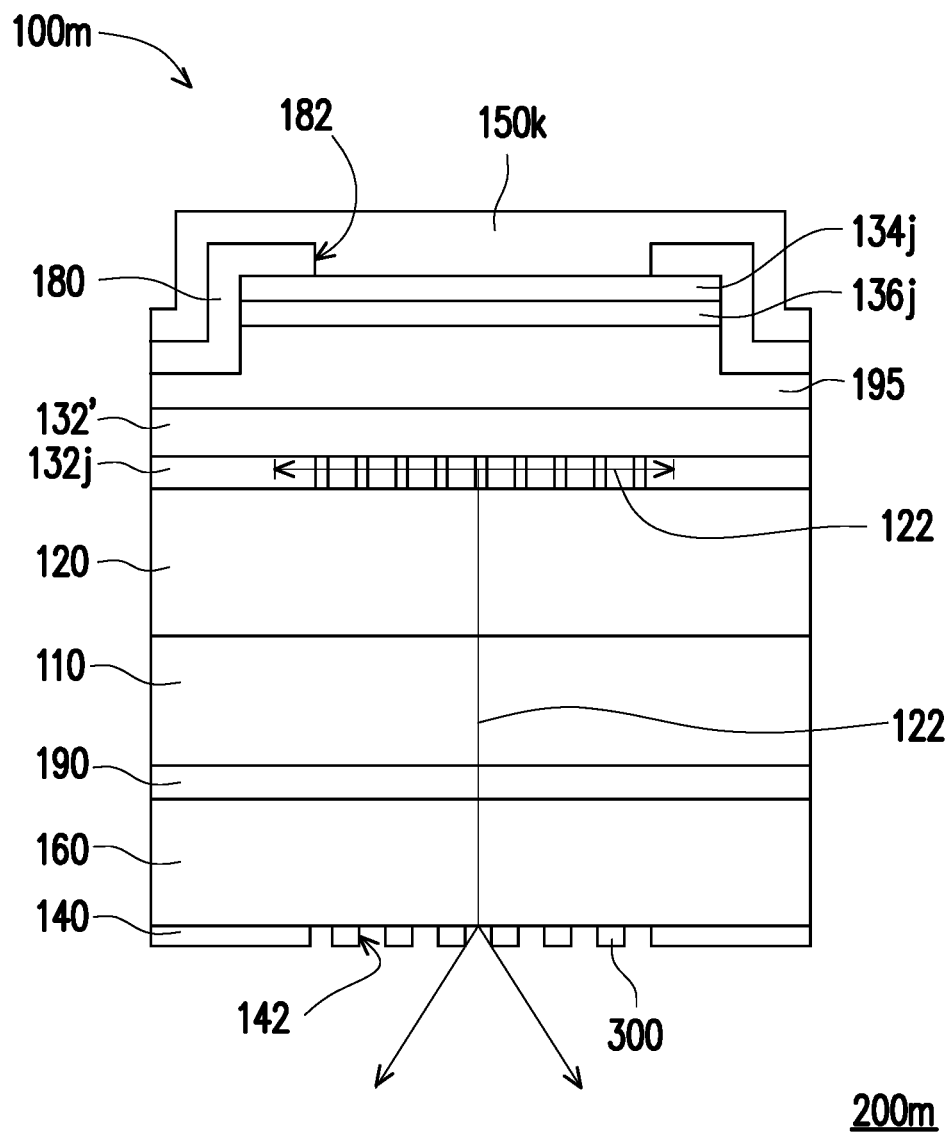
FIG. 11 is a cross-sectional schematic view of a photonic crystal surface emitting laser device of yet another embodiment of the disclosure.

FIG. 11 is a cross-sectional schematic view of a photonic crystal surface emitting laser device of yet another embodiment of the disclosure. Referring to FIG. 11, a photonic crystal surface emitting laser device 200m of this embodiment is similar to the photonic crystal surface emitting laser device 200k of FIG. 10, and the differences between the two are as described below. A photonic crystal surface emitting laser unit 100m of the photonic crystal surface emitting laser device 200m of this embodiment further includes a distributed Bragg reflector 195 disposed between the semiconductor layer 132' and the graded index layer 136j.

In other embodiments, the photonic crystal layer 130 in FIG. 6, FIG. 7, and FIG. 8 and the structures thereon may also be changed to a cladding layer 132j, a semiconductor layer 132', a graded index layer 136j, an ohmic contact layer 134j, and a second electrode 150k, as shown in FIG. 10 or FIG. 11, and do not have a transparent conductive layer 170. That is, the structures above the light-emitting layer 120 in FIG. 6, FIG. 7, and FIG. 8 may be replaced with, for example, the structures above the light-emitting layer 120 in FIG. 10 or FIG. 11, to form other six types of photonic crystal surface emitting laser units.

Figure 12:
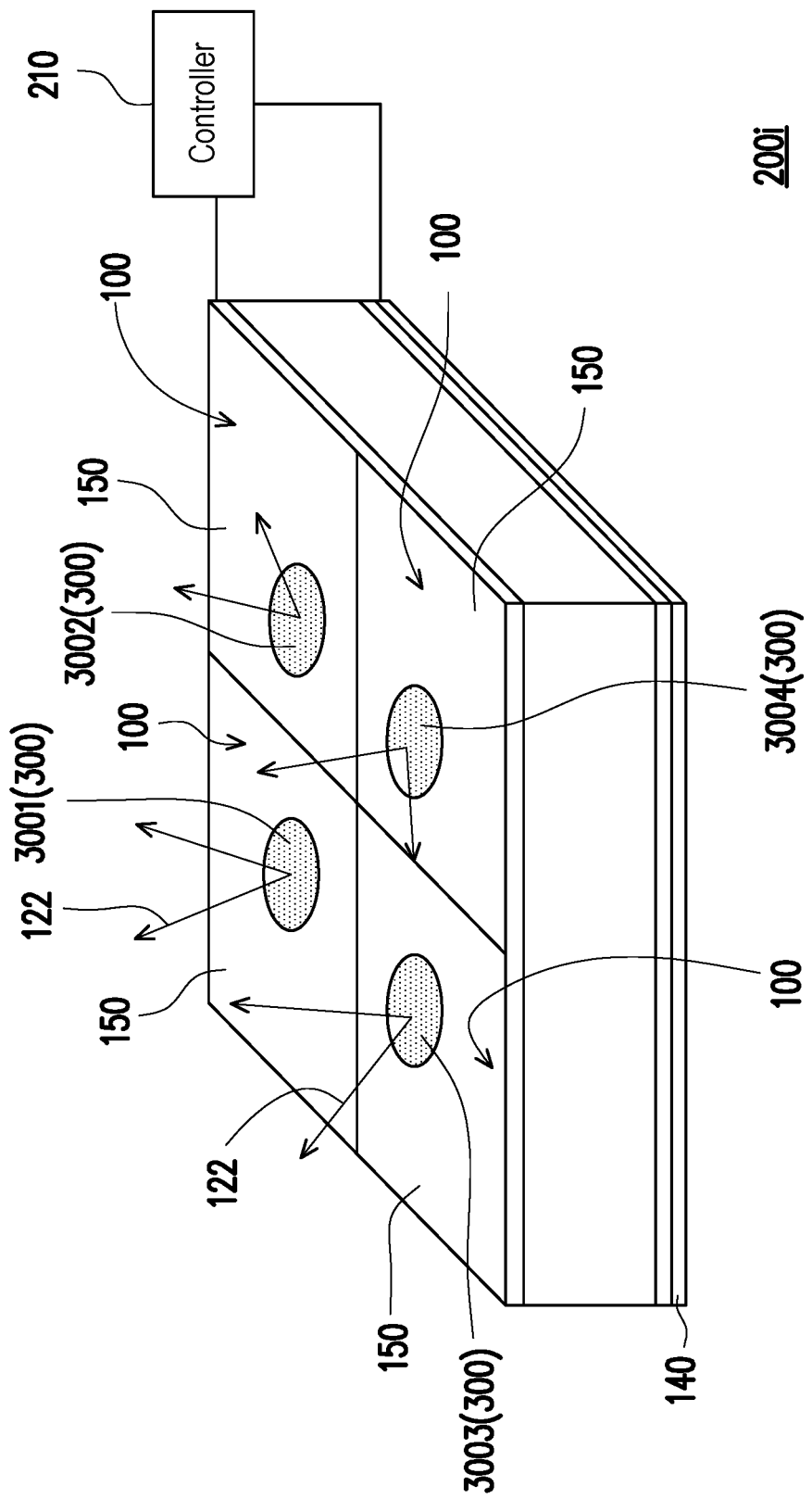
FIG. 12 is a cross-sectional schematic view of a photonic crystal surface emitting laser device of yet another embodiment of the disclosure.

FIG. 12 is a cross-sectional schematic view of a photonic crystal surface emitting laser device of yet another embodiment of the disclosure. Referring to FIG. 12, a photonic crystal surface emitting laser device 200i of this embodiment is similar to the photonic crystal surface emitting laser device 200 of FIG. 1A, and the differences between the two are as described below. The photonic crystal surface emitting laser device 200i of this embodiment includes multiple photonic crystal surface emitting laser units 100 arranged in an array. FIG. 12 is illustrated with 2×2 photonic crystal surface emitting laser units 100 as an example. However, in other embodiments, the array may be M×N photonic crystal surface emitting laser units 100, where M and N are any positive integers. For example, in one embodiment, the photonic crystal surface emitting laser device 200i may include 10×10 photonic crystal surface emitting laser units 100. At least one of the periods and the arrangement directions of multiple diffractive gratings 300 of the photonic crystal surface emitting laser units 100 are different. For example, a diffractive grating 3001, a diffractive grating 3002, a diffractive grating 3003, and a diffractive grating 3004 in FIG. 12 have different periods and/or arrangement directions (i.e., periodic directions). For example, different periodic directions P1 as shown in FIG. 1B to FIG. 1E may be adopted to form different exiting directions of the light beams 122.

In this embodiment, the photonic crystal surface emitting laser units 100 are electrically connected to a controller 210. The controller 210 may individually and independently control the emitted light of the photonic crystal surface emitting laser units 100. For example, since the light-emitting directions of the photonic crystal surface emitting laser units 100 are different, the controller 210 may control the photonic crystal surface emitting laser units 100 to sequentially emit light beams 122 (i.e., laser beams) in different directions, to achieve beam scanning. Since such beam scanning is electronically controlled rather than mechanically controlled, this embodiment attains faster scanning speeds, higher reliability, and better durability. Such a photonic crystal surface emitting laser device 200i may be applied to light detection and distance measurement, such as being applied to lidar or three-dimensional sensing, and has the advantages of high speed, high reliability, and high durability. In addition, this kind of laser that does not rely on mechanical actuation, has high power, has high beam quality and may achieve two-dimensional scanning (i.e., the photonic crystal surface emitting laser device 200i) may also be applied to the sensing system of smart mobility, object recognition system, or adaptive lighting, etc.

In this embodiment, the controller 210 may be designed through a hardware description language (HDL) or any other digital circuit and analog circuit design method known to those with ordinary knowledge in the art, and the hardware circuit may be realized through a field programmable gate array (FPGA), a complex programmable logic device (CPLD), or an application-specific integrated circuit (ASIC).

In addition, the photonic crystal surface emitting laser unit 100 in the photonic crystal surface emitting laser device 200i may also be replaced with the photonic crystal surface emitting laser units of other embodiments described above (for example, the photonic crystal surface emitting laser unit 100a to the photonic crystal surface emitting laser unit 100h) to form various photonic crystal surface emitting laser devices having photonic crystal surface emitting laser units arranged in an array.

To sum up, in the photonic crystal surface emitting laser device of the embodiment of the disclosure, since the diffractive grating disposed on the photonic crystal layer or the doped semiconductor layer is adopted to diffract the laser beam diffracted by the photonic crystal layer, therefore the exiting light deflection direction of the laser beam may be determined by using a simple structure. The photonic crystal surface emitting laser device of an embodiment of the disclosure may include multiple photonic crystal surface emitting laser units arranged in an array, and at least one of the periods and the arrangement directions of multiple diffractive gratings 300 of the photonic crystal surface emitting laser units 100 are different. Since the light-emitting directions of the photonic crystal surface emitting laser units are different, the controller may control the photonic crystal surface emitting laser units to sequentially emit laser beams in different directions, to achieve beam scanning. Since such beam scanning is electronically controlled rather than mechanically controlled, the embodiment attains faster scanning speeds, higher reliability, and better durability. Such a photonic crystal surface emitting laser device may be applied to light detection and distance measurement, such as being applied to lidar or three-dimensional sensing, and has the advantages of high speed, high reliability, and high durability.

What is claimed is:

1. A photonic crystal surface emitting laser device, comprising:
   at least one photonic crystal surface emitting laser unit, the photonic crystal surface emitting laser unit comprising:
   a light-emitting layer, configured to emit a light beam;
   a photonic crystal layer, disposed on one side of the light-emitting layer;
   a doped semiconductor layer, disposed on another side of the light-emitting layer; and
   a diffractive grating, disposed on the photonic crystal layer or the doped semiconductor layer; and
   a first electrode, electrically connected to the doped semiconductor layer, wherein the photonic crystal surface emitting laser unit further comprises a second electrode, disposed on the photonic crystal layer and electrically connected to the photonic crystal layer, and wherein a portion of the second electrode is the diffractive grating, and after the light beam is diffracted by the photonic crystal layer and the diffractive grating, the light beam is emitted from the photonic crystal surface emitting laser unit.

2. The photonic crystal surface emitting laser device according to claim 1, wherein the photonic crystal surface emitting laser unit further comprises a transparent conductive layer disposed between the photonic crystal layer and the second electrode.

3. The photonic crystal surface emitting laser device according to claim 1, further comprising a substrate, disposed between the doped semiconductor layer and the first electrode.

4. The photonic crystal surface emitting laser device according to claim 1, further comprising a substrate, wherein the doped semiconductor layer and the first electrode are disposed on a same side of the substrate.

5. The photonic crystal surface emitting laser device according to claim 1, further comprising a substrate, disposed between the doped semiconductor layer and the diffractive grating.

6. The photonic crystal surface emitting laser device according to claim 1, wherein the at least one photonic crystal surface emitting laser unit is a plurality of photonic crystal surface emitting laser units arranged in an array, at least one of periods and arrangement directions of a plurality of diffractive gratings of the photonic crystal surface emitting laser units are different.

* * * * *